United States Patent
Hung

(10) Patent No.: US 11,251,406 B2
(45) Date of Patent: Feb. 15, 2022

(54) BOROSILICATE LIGHT EXTRACTION REGION

(71) Applicant: VITRO FLAT GLASS LLC, Cheswick, PA (US)

(72) Inventor: Cheng-Hung Hung, Wexford, PA (US)

(73) Assignee: Vitro Flat Glass LLC, Cheswick, PA (US)

( * ) Notice: Subject to any disclaimer, the term of this patent is extended or adjusted under 35 U.S.C. 154(b) by 0 days.

(21) Appl. No.: 16/295,566

(22) Filed: Mar. 7, 2019

(65) Prior Publication Data

US 2020/0287166 A1 Sep. 10, 2020

(51) Int. Cl.
*H01L 51/52* (2006.01)
*H01L 51/00* (2006.01)
*H01L 51/56* (2006.01)
*C03B 18/12* (2006.01)
*C03B 18/20* (2006.01)

(52) U.S. Cl.
CPC .......... *H01L 51/5268* (2013.01); *C03B 18/12* (2013.01); *C03B 18/20* (2013.01); *H01L 51/0096* (2013.01); *H01L 51/5206* (2013.01); *H01L 51/56* (2013.01); *H01L 2251/303* (2013.01); *H01L 2251/305* (2013.01); *H01L 2251/306* (2013.01); *H01L 2251/5369* (2013.01); *H01L 2251/556* (2013.01); *H01L 2251/558* (2013.01)

(58) Field of Classification Search
None
See application file for complete search history.

(56) References Cited

U.S. PATENT DOCUMENTS

| | | | | |
|---|---|---|---|---|
| 5,021,388 A * | 6/1991 | Fridez | ............... | B01D 53/945 423/213.5 |
| 6,821,804 B2 * | 11/2004 | Thibeault | ............... | H01L 33/20 438/29 |
| 8,125,128 B2 * | 2/2012 | Funayama | ............... | B82Y 30/00 313/116 |
| 8,298,032 B2 * | 10/2012 | Potts | ............... | B82Y 30/00 445/24 |
| 8,299,706 B2 * | 10/2012 | Otterman | ............... | C03B 19/00 313/512 |
| 9,123,914 B2 * | 9/2015 | Lee | ............... | H01L 51/5212 |
| 2003/0039843 A1 * | 2/2003 | Johnson | ............... | C03C 17/002 428/432 |
| 2006/0050356 A1 * | 3/2006 | Varaprasad | ............... | B60R 1/12 359/265 |
| 2008/0030130 A1 * | 2/2008 | Ottermann | ............... | C03B 19/00 313/504 |

(Continued)

FOREIGN PATENT DOCUMENTS

EP 1860919 A1 11/2007
WO 03009061 A2 1/2003

OTHER PUBLICATIONS

Mann et al. "Dielectric nanoparticles for the enhancement of OLED light extraction", Nov. 28, 2016, pp. 202-207 (Year: 2016).*
Written Search report for PCT/US2020/021392 (Year: 2020).*

*Primary Examiner* — Telly D Green
(74) *Attorney, Agent, or Firm* — The Webb Law Firm

(57) ABSTRACT

The invention relates to a light extraction substrate having a light extraction layer. The light extraction layer includes boron, boroate, and/or borosilicate as well as nanoparticles.

10 Claims, 4 Drawing Sheets

(56) References Cited

U.S. PATENT DOCUMENTS

| | | | |
|---|---|---|---|
| 2009/0015142 A1* | 1/2009 | Potts | B82Y 20/00 |
| | | | 313/504 |
| 2009/0072733 A1* | 3/2009 | Funayama | G02B 6/0051 |
| | | | 313/506 |
| 2009/0102008 A1* | 4/2009 | Kakehata | H01L 21/76254 |
| | | | 257/506 |
| 2012/0200929 A1* | 8/2012 | Lu | H01L 51/5268 |
| | | | 359/599 |
| 2013/0187141 A1* | 7/2013 | Nakamura | H01L 51/5268 |
| | | | 257/40 |
| 2014/0334160 A1* | 11/2014 | Lee | H01L 51/5268 |
| | | | 362/311.02 |
| 2015/0008401 A1* | 1/2015 | Lee | H01L 51/5212 |
| | | | 257/40 |
| 2015/0097166 A1* | 4/2015 | Setz | H01L 51/5268 |
| | | | 257/40 |
| 2016/0097495 A1* | 4/2016 | Yamamoto | G02B 6/005 |
| | | | 349/65 |
| 2017/0081241 A1* | 3/2017 | Sanderson | C03C 15/00 |
| 2017/0133634 A1* | 5/2017 | Park | C08J 5/00 |
| 2017/0183255 A1* | 6/2017 | Walther | C03C 3/083 |
| 2018/0128957 A1* | 5/2018 | Davis | C03C 15/00 |
| 2018/0208500 A1* | 7/2018 | Lee | C03C 13/046 |
| 2019/0036082 A1* | 1/2019 | Cheng | H01L 51/5206 |

\* cited by examiner

BOROSILICATE LIGHT EXTRACTION REGION

BACKGROUND OF THE INVENTION

Field of the Invention

This invention relates to forming a borosilicate layer within or over a substrate, for example glass or a glass ribbon, and optionally embedding nanoparticles into the borosilicate layer. This invention also relates to organic light emitting diodes, solar or photovoltaic (PV) cells, daylighting windows, and, more particularly, to a substrate having increased light scattering for improved light utilization.

Description of Related Art

An organic light emitting diode ("OLED") is a light-emitting device having an emissive electroluminescent layer incorporating organic compounds. The organic compounds emit light in response to an electric current. Typically, an emissive layer of organic semiconductor material is situated between two electrodes (an anode and a cathode). When an electric current is passed between the anode and the cathode, the organic material emits light. OLEDs are used in numerous applications, such as television screens, computer monitors, mobile phones, PDAs, watches, lighting, and various other electronic devices.

OLEDs provide numerous advantages over conventional inorganic devices, such as liquid crystal displays. For example, an OLED functions without the need for a back light. In low ambient light, such as a dark room, an OLED screen can achieve a higher contrast ratio than conventional liquid crystal displays. OLEDs are also thinner, lighter, and more flexible than liquid crystal displays and other lighting devices.

In making OLEDs, one typically adds a light extraction region wherein nanoparticles are embedded partially or completely within the light extraction region. For example, nanoparticles may be embedded within the substrate. When the substrate is glass, the nanoparticles must be embedded while the substrate is at a temperate of greater than 725° C., typically greater than 800° C. There is a need for embedding nanoparticles into a glass substrate when the glass ribbon is at a lower temperature, such as less than or equal to 725° C.

SUMMARY OF THE INVENTION

The invention relates to a light extraction substrate. The substrate comprises glass. The glass has a first surface and a second surface, which is opposite the first surface. A light extraction layer is positioned over the first surface. The light extraction layer comprises borosilicate. The light extraction layer may or may not comprise a nanoparticle. The light extraction substrate may further comprise an external light extraction layer over or on the second surface of the substrate. The internal light extraction layer may be part of the substrate or may be a discrete layer over the substrate.

In another embodiment, the invention relates to an organic light emitting diode ("OLED"). The OLED comprises a substrate having a first surface and a second surface. The second surface is opposite the first surface. A light extraction layer is positioned over the first surface of the substrate. The light extraction layer comprises a borosilicate layer. A transparent conductive oxide layer is positioned over at least a portion of the light extraction layer. An emissive layer is positioned over at least a portion of the transparent conductive oxide layer. A cathode layer is positioned over at least a portion of the emissive layer.

Another embodiment of the invention relates to a method of making a light extraction substrate. The method comprises pouring a glass melt onto a molten metal bath. A boron precursor is applied over the glass melt while the glass melt has a temperature of at least 600° C. and not more than 725° C.

Another embodiment of the invention relates to a method of making a light extraction substrate. The method comprises pouring a glass melt onto a molten metal bath. The glass melt contains silicon. A boron precursor is applied over the glass melt while the glass melt has a temperature of at least 600° C. and not more than 725° C. The silicon within the glass melt reacts with the boron precursor to form a borosilicate over the glass melt.

Another embodiment of the invention relates to a method of making a light extraction substrate. The method comprises pouring a glass melt onto a molten metal bath. The glass melt contains silicon. A boron precursor is applied over the glass melt while the glass melt has a temperature of less than 725° C. A silicon precursor is applied over the glass melt wherein the glass melt has a temperature of less than 725° C. The silicon precursor and boron precursor form a borosilicate over or within the glass melt.

DESCRIPTION OF THE INVENTION

Figure 1A:
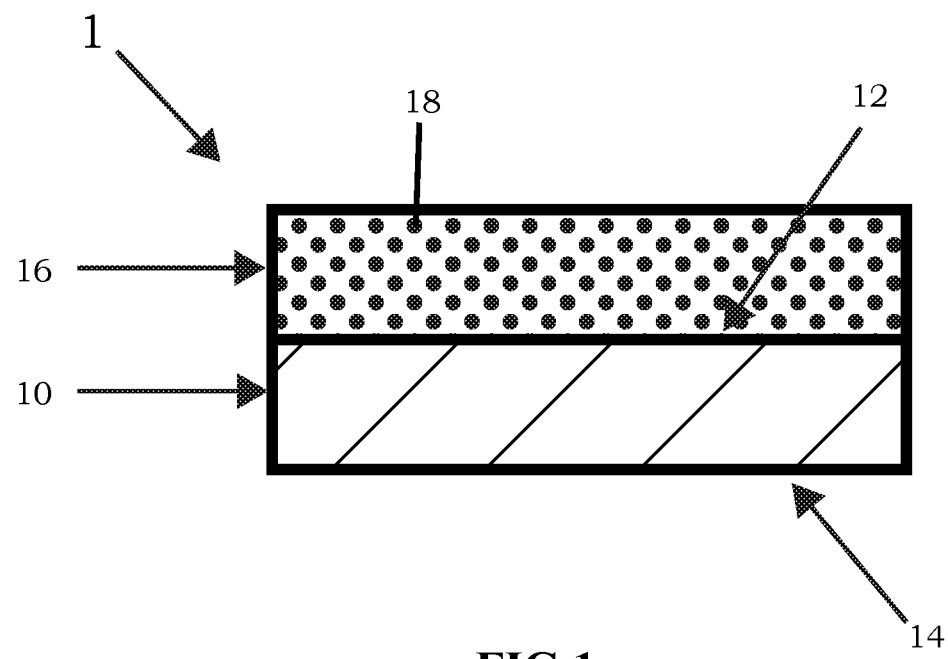
FIG. 1a is a side, sectional view of a substrate with a light extraction layer over the first surface of the substrate.

As used herein, spatial or directional terms, such as "left", "right", "inner", "outer", "above", "below", and the like, relate to the invention as it is shown in the drawing figure. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Additionally, all documents, such as but not limited to, issued patents and patent applications, referred to herein are to be considered to be "incorporated by reference" in their entirety. Any reference to amounts, unless otherwise specified, is "by weight percent".

When referring to a layer of a coating, the term "over" means "farther from the substrate surface". For example, a second layer located "over" a first layer means that the second layer is located farther from the substrate surface on which the layers are present than is the first layer. The second layer can be in direct contact with the first layer or one or more other layers can be located between the second layer and the first layer.

All documents referred to herein are to be considered to be "incorporated by reference" in their entirety.

Any reference to amounts, unless otherwise specified, is "by weight percent".

The term "film" means a region having a desired or selected composition. A "layer" comprises one or more "films". A "coating" is comprised of one or more "layers". The term "organic material" includes polymers as well as small molecule organic materials that can be used to fabricate organic opto-electronic devices.

The term "visible light" means electromagnetic radiation having a wavelength in the range of 380 nm to 780 nm. The term "infrared radiation" means electromagnetic radiation having a wavelength in the range of greater than 780 nm to 100,000 nm. The term "ultraviolet radiation" means electromagnetic energy having a wavelength in the range of 100 nm to less than 380 nm.

The terms "metal" and "metal oxide" include silicon and silica, respectively, as well as traditionally recognized metals and metal oxides, even though silicon may not be conventionally considered a metal. The term "curable" means a composition capable of polymerizing or crosslinking. By "cured" is meant that the material is at least partly polymerized or cross-linked, preferably fully polymerized or cross-linked. By "at least" is meant "greater than or equal to". By "not more than" is meant "less than or equal to". The terms "upstream" and "downstream" refer to the direction of travel of the glass ribbon.

Haze and transmittance values herein are those determined using a Haze-Gard Plus hazemeter (commercially available from BYK-Gardner USA) or a Perkin Elmer Lamda 9 Spectrophotometer. Surface roughness values are those determined using an Instrument Dimension 3100 Atomic Force Microscope.

The discussion of the invention may describe certain features as being "particularly" or "preferably" within certain limitations (e.g., "preferably", "more preferably", "even more preferably", or "most preferably" within certain limitations). It is to be understood that the invention is not limited to these particular or preferred limitations but encompasses the entire scope of the disclosure.

The invention comprises, consists of, or consists essentially of, the following aspects of the invention, in any combination. Various aspects of the invention are illustrated in separate drawing figures. However, it is to be understood that this is simply for ease of illustration and discussion. In the practice of the invention, one or more aspects of the invention shown in one drawing figure can be combined with one or more aspects of the invention shown in one or more of the other drawing figures.

The invention relates to a substrate that comprises a light extraction layer 16 with nanoparticles 18 embedded in the light extraction layer 16. As shown in FIG. 1, a substrate 10 is provided. The substrate 10 can have a high visible light transmission. By "high visible light transmission" is meant a visible light transmission at a reference wavelength of 550 nanometers (nm) and a reference thickness of 2 mm of at least 85%, such as at least 87%. For example, such as at least 90%. For example, such as at least 91%. For example, such as at least 92%. For example, such as at least 93%. The substrate 10 having the light extraction layer 16 and nanoparticles 18 can have a haze of at least 20%, preferably at least 30%, more preferably at least 35%, most preferably at least 37%.

The substrate 10 can be glass. For example, the substrate 10 can be a low iron glass. By "low iron" is meant having a total Iron content of less than 400 parts per million (ppm), such as less than 350 ppm. For example, the total iron content can be less than 300 ppm. For example, the total iron content can be less than 200 ppm. Examples of suitable materials for the substrate 10 include soda-lime silicate glass, for example, float glass. The substrate 10 can be a glass ribbon. Glass ribbon is a hot glass that floats on a metal bath (e.g. tin bath), and is gradually cooled while floating on the metal bath. The glass ribbon is gradually cool from about 1100° C. to approximately 600° C. while on the metal bath.

The substrate 10 can be of any desired thickness. For example, the substrate 10 can have a thickness in the range of 0.5 mm to 10 mm, such as 1 mm to 10 mm, such as 1 mm to 4 mm. For example, the substrate 10 can have a thickness in the range of 2 mm to 3.2 mm.

The substrate 10 has a first surface 12 and a second surface 14. The second surface 14 is opposite the first surface 12.

As shown in FIG. 1A, a light extraction layer 16 is positioned over at least a portion of the first surface 12, or partially embedded within the substrate 10. The light extraction layer 16 comprises borosilicate. Borosilicate is a glass that contains silica ($SiO_2$) and boron trioxide ($B_2O_3$). The light extraction layer 16 with nanoparticles 18 is generally smooth, and can have an average surface roughness of less than 5 nm.

The light extraction layer 16 may be formed over the first surface 12 of the substrate 10 according to the following method. The substrate 10 can be glass. The substrate 10 is provided at a temperature of no more than 650° C., preferably no more than 630° C., more preferably no more than 620° C., most preferably no more than 610° C.; and/or at a temperature of at least 400° C.; preferably at least 500° C.; more preferably at least 525° C.; most preferably at least 550° C. For example, substrate 10 may be at a temperature of about 600° C. The light extraction layer 16 is applied by applying a boron precursor that will form a borosilicate. The boron precursor can be tri-methyl borate, tri-ethyl borate, phenylboron dichloride, boron bromide or boron fluoride. In one non-limiting embodiment, the boron precursor is trimethyl borate. When the boron precursor is applied to the substrate 10 within the temperature described in this paragraph, the silicon can diffuse from the glass substrate 10 and react with the boron species to form the borosilicate. If the temperature is below 400° C., it is unlikely that the boron precursor will form $B_2O_3$.

Figure 1B:
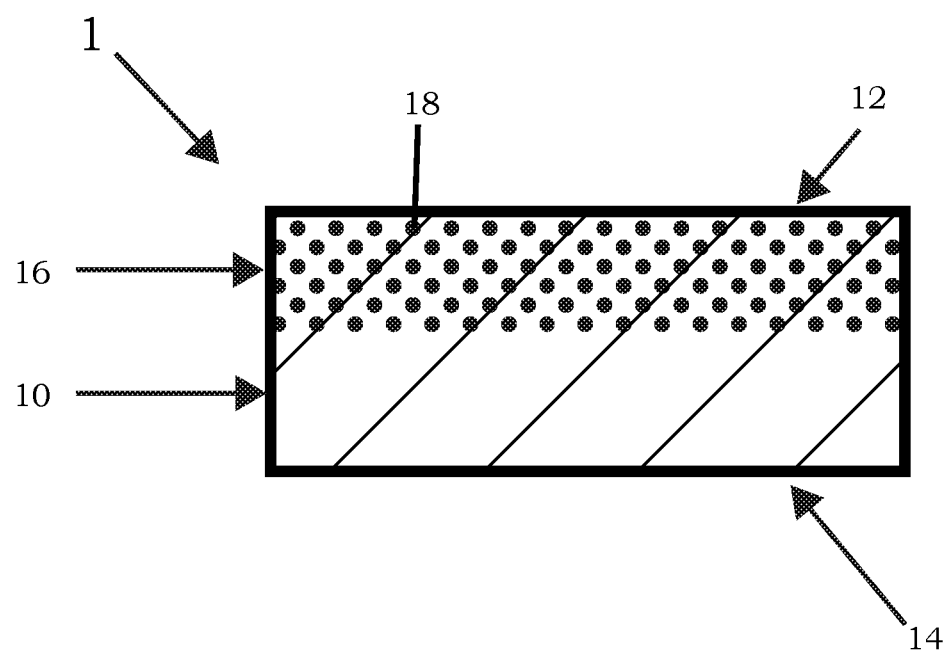
FIG. 1b is a side, sectional view of a substrate with a light extraction layer embedded within the substrate at the first surface.

If the temperature is above 650° C., it is likely that the light extraction layer 16 will form (at least in part) within the substrate 10 (as shown in FIG. 1B). Thus, an alternative embodiment of the invention is shown in FIG. 1B, wherein the light extraction layer 16 is positioned, partially or entirely, within; or can be an integral part of the substrate 10. In this embodiment, the light extraction layer 16 is positioned partially or entirely beneath the first surface 12, or entirely beneath the first surface and between the first surface 12 and the second surface 14.

The light extraction layer 16 may be formed over the first surface 12 of the substrate 10 in several ways. One method is related to an embodiment wherein the substrate is glass, for example float glass or soda-lime glass. In this method, a glass melt is poured onto a metal bath to form a glass ribbon. A boron precursor is applied over glass ribbon. The boron precursor is applied when the glass ribbon has a temperature at or below 800° C., preferably at or below 750° C., most preferably at or below 730° C., most preferably at or below 725° C.; and at or above 500° C., preferably at or above 550° C., more preferably at or above 575° C., most preferably at or above 600° C. For example, the glass ribbon can be at a temperate of about 650° C.

When the borosilicate is applied to a glass ribbon when the glass ribbon is at least 500° C., some of the silicon in the glass ribbon diffuses into the borate layer to form a borosilicate coating.

The boron precursor can alternatively be applied over the substrate 10 when the substrate is below 500° C., preferably below 300° C., more preferably below 200° C., most preferably below 100° C. For example, the substrate can have a temperature of approximately 20-25° C., or can be at room temperature.

Optionally, a silicon precursor can be applied before, simultaneously, and/or immediately after the boron precursor is applied to form a borosilicate. The silicon precursor can be tetraethyl orthosilicate, silicon acetate, silane, chlorosilane, methyl chlorosilane, ethyl chlorosilane, or silicon chloride. In one non-limiting example, the silicon precursor is tetraethyl orthosilicate.

For example, the silicon precursor can be supplied into a vaporizer at the same time that the boron precursor is supplied into the vaporizer. The silicon precursor and boron precursor are vaporized by the vaporizer at the same time forming a vaporized boron and silicon precursors. The vaporized boron and silicon precursors can be fed into a coater where the vaporized boron and silicon precursors are applied to the glass ribbon.

In another example, the silicon precursor can be fed into a first vaporizer. The first vaporizer vaporizes the silicon precursor forming a vaporized silicon precursor. The vaporized silicon precursor is fed into a coater, which applies the vaporized silicon precursor onto the glass ribbon. After the vaporized silicon precursor is applied to the glass ribbon, a vaporized boron precursor is applied to the glass ribbon, which contains the vaporized and applied silicon precursor. The vaporized boron precursor is formed by feeding a boron precursor into a second vaporizer. The second vaporizer vaporizes the boron precursor. The vaporized boron precursor is fed to a second coater, which applies the vaporized boron precursor to the glass ribbon, which contains the vaporized and applied vaporized silicon precursor. The application of the vaporized silicon precursor and the vaporized boron precursor forms a borosilicate layer, which, depending on the temperature of the glass ribbon, can reside over the glass ribbon, or can be embedded within or become an integral part of the glass ribbon, wherein the top portion of the glass ribbon comprises the borosilicate layer.

In another example, the boron precursor can be fed into a first vaporizer. The first vaporizer vaporizes the boron precursor forming a vaporized boron precursor. The vaporized boron precursor is fed into a coater, which applies the vaporized boron precursor onto the glass ribbon. After the vaporized boron precursor is applied to the glass ribbon, a vaporized silicon precursor is applied to the glass ribbon, which contains the vaporized and applied boron precursor. The vaporized silicon precursor is formed by feeding a silicon precursor into a second vaporizer. The second vaporizer vaporizes the silicon precursor. The vaporized silicon precursor is fed to a second coater, which applies the vaporized silicon precursor to the glass ribbon, which contains the vaporized and applied vaporized boron precursor. The application of the vaporized boron precursor and the vaporized silicon precursor forms a borosilicate layer, which, depending on the temperature of the glass ribbon, can reside over the glass ribbon, or can be embedded within or become an integral part of the glass ribbon, wherein the top portion of the glass ribbon comprises the borosilicate layer.

In another example, the silicon precursor can be fed into a first vaporizer. The first vaporizer vaporizes the silicon precursor forming a vaporized silicon precursor. The vaporized silicon precursor is fed into a coater, which applies the vaporized silicon precursor onto the glass ribbon. After the vaporized silicon precursor is applied to the glass ribbon, a vaporized boron precursor and a second vaporized silicon precursor are applied to the glass ribbon, which contains the vaporized and applied silicon precursor. The vaporized boron precursor and vaporized silicon precursor is formed by feeding a boron precursor and a silicon precursor into a second vaporizer. The second vaporizer vaporizes the boron precursor and the silicon precursor forming a vaporized boron and silicon precursor. The vaporized boron and silicon precursor is fed to a second coater, which applies the vaporized boron and silicon precursor to the glass ribbon, which contains the vaporized and applied vaporized silicon precursor. This forms a borosilicate layer, which, depending on the temperature of the glass ribbon, can reside over the glass ribbon, or can be embedded within or become an integral part of the glass ribbon, wherein the top portion of the glass ribbon comprises the borosilicate layer.

In another example, the silicon precursor and a boron precursor can be fed into a first vaporizer. The first vaporizer vaporizes the silicon precursor and boron precursor forming a vaporized silicon and boron precursor. The vaporized silicon and boron precursor is fed into a coater, which applies the vaporized silicon and boron precursor onto the glass ribbon. After the vaporized silicon and boron precursor is applied to the glass ribbon, a vaporized silicon precursor is applied to the glass ribbon, which contains the vaporized and applied silicon and boron precursor. The vaporized silicon precursor is formed by feeding a silicon precursor into a second vaporizer. The second vaporizer vaporizes the silicon precursor. The vaporized silicon precursor is fed to a second coater, which applies the vaporized silicon precursor to the glass ribbon, which contains the vaporized and applied vaporized silicon and boron precursor. This forms a borosilicate layer, which, depending on the temperature of the glass ribbon, can reside over the glass ribbon, or can be embedded within or become an integral part of the glass ribbon, wherein the top portion of the glass ribbon comprises the borosilicate layer.

In another example, the silicon precursor can be fed into a first vaporizer. The first vaporizer vaporizes the silicon precursor forming a vaporized silicon precursor. The vaporized silicon precursor is fed into a coater, which applies the vaporized silicon precursor onto the glass ribbon. After the vaporized silicon precursor is applied to the glass ribbon, a vaporized boron precursor is applied to the glass ribbon, which contains the vaporized and applied silicon precursor. The vaporized boron precursor is formed by feeding a boron precursor into a second vaporizer. The second vaporizer vaporizes the boron precursor. The vaporized boron precursor is fed to a second coater, which applies the vaporized boron precursor to the glass ribbon, which contains the vaporized and applied vaporized silicon precursor. A second silicon precursor is vaporized and applied via a third vaporizer and third coater similar to how the first silicon precursor was vaporized and applied, except that the third vaporizer and third coater are positioned downstream of the first vaporizer and coater and the second vaporizer and coater. This forms a borosilicate layer, which, depending on the temperature of the glass ribbon, can reside over the glass ribbon, or can be embedded within or become an integral part of the glass ribbon, wherein the top portion of the glass ribbon comprises the borosilicate layer.

The light extraction layer can also be formed by the following, alternative method. In this method, a glass melt is poured onto a metal bath to form a glass ribbon. A boron precursor is applied over glass ribbon. The boron precursor is applied to the glass ribbon when the glass ribbon has a temperature of no more than 650° C., preferably no more than 630° C., more preferably no more than 620° C., most preferably no more than 610° C.; and/or at a temperature of at least 400° C.; preferably at least 500° C.; more preferably at least 525° C.; most preferably at least 550° C. For example, the temperature may be about 600° C. Optionally, a silicon precursor can be applied before, simultaneously, or immediately after the boron precursor is applied to form a borosilicate in the same manner as described above. By this method, the light extraction layer 16 would form a distinct borate or borosilicate layer applied over the first surface, but rather integrated into the substrate 10 as if it is part of the substrate.

The light extraction layer 16 can have a thickness of at least 0.1 microns, preferably at least 0.25 microns, more preferably at least 0.4 microns, most preferably at least 0.5 micron. The light extraction layer 16 can have a thickness of at most 3 microns, preferably at most 2.75 microns, more preferably at most 2.5 microns, most preferably at most 2.25 micron. In certain embodiments, the extraction layer 16 is positioned over the first surface 12 of the substrate, the light extraction layer 16 can have a thickness of at least 0.1 microns, preferably at least 0.25 microns, more preferably at least 0.4 microns, most preferably at least 0.5 micron; and can have a thickness of at most 2 microns, preferably at most 1.75 microns, more preferably at most 1.5 microns, most preferably at most 1.25 micron. In other embodiments, the light extraction layer 16 is embedded or partially embedded in the first surface 12 of the substrate 10, the light extraction layer 16 can have a thickness of at least 0.5 microns, preferably at least 075 microns, more preferably at least 0.9 microns, most preferably at least 1 micron; and can have a thickness of at most 3 microns, preferably at most 2.75 microns, more preferably at most 2.5 microns, most preferably at most 2.25 micron.

Optionally, nanoparticles 18 can be embedded in the light extraction layer 16. The nanoparticles may be a material that has a higher refractive index than the substrate, i.e., is a high index of refraction material. For example, the nanoparticles 18 may be metal oxides. For example, the nanoparticles 18 may be alumina, titania, cerium oxide, zinc oxide, tin oxide, silica, zirconia, mixtures thereof or alloys thereof. Other examples include metallic nanoparticles. For example but not limited to iron, steel, copper, silver, gold, and titanium. Further examples include alloy nanoparticles containing alloys of two or more materials. For example, alloys of two or more of zinc, tin, gold, copper, and silver. In one specific embodiment, the nanoparticles comprise titania.

The nanoparticles 18 can have a diameter of up to 50 nm, preferably up to 45 nm, more preferably up to 40 nm; most preferably up to 35 nm. The nanoparticles 18 can have a diameter of at least 5 nm, preferably at least 10 nm, more preferably at least 15 nm; most preferably at least 20 nm.

The nanoparticles 18 in the light extraction layer 16 can be present in the range of 0.1 weight percent to 50 weight percent, such as 0.1 weight percent to 40 weight percent, such as 0.1 weight percent to 30 weight percent, such as 0.1 weight percent to 20 weight percent, such as 0.1 weight percent to 10 weight percent, such as 0.1 weight percent to 8 weight percent, such as 0.1 weight percent to 6 weight percent, such as 0.1 weight percent to 5 weight percent, such as 0.1 to 2 weight percent, such as 0.1 to 1 weight percent, such as 0.1 to 0.5 weight percent, such as 0.1 to 0.4 weight percent, such as 0.1 to 0.3 weight percent, such as 0.2 weight percent to 10 weight percent, such as 0.2 weight percent to 5 weight percent, such as 0.2 weight percent to 1 weight percent, such as 0.2 weight percent to 0.8 weight percent, such as 0.2 weight percent to 0.4 weight percent.

Figure 2A:
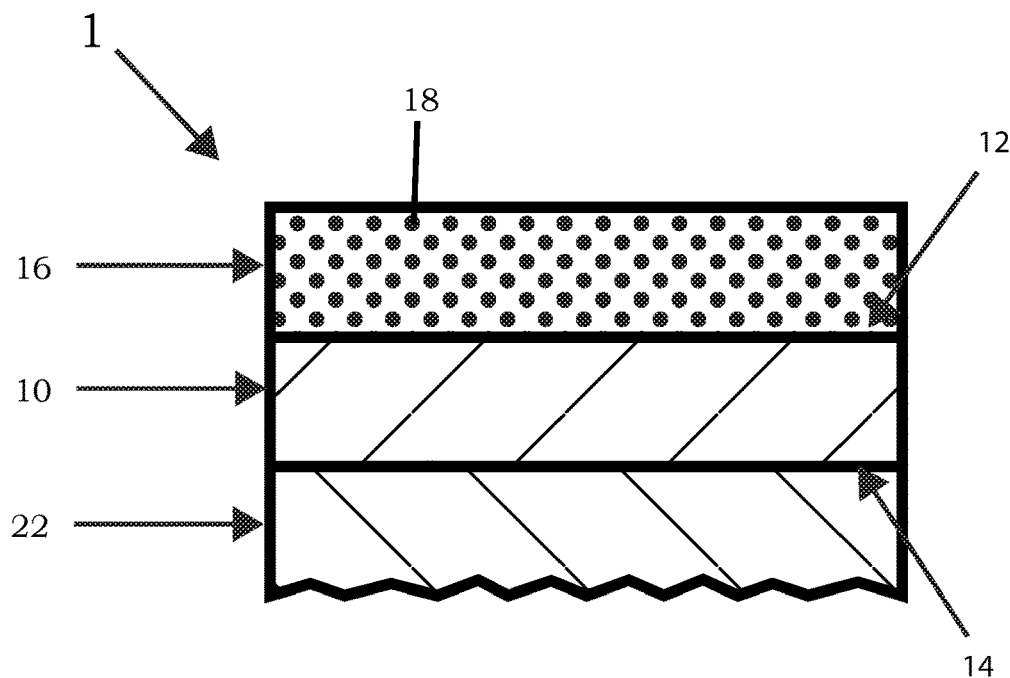
FIG. 2a is a side, sectional view of a substrate with a light extraction layer over the first surface of the substrate and an external light extraction region layer on or over the second surface of the substrate.
Figure 2B:
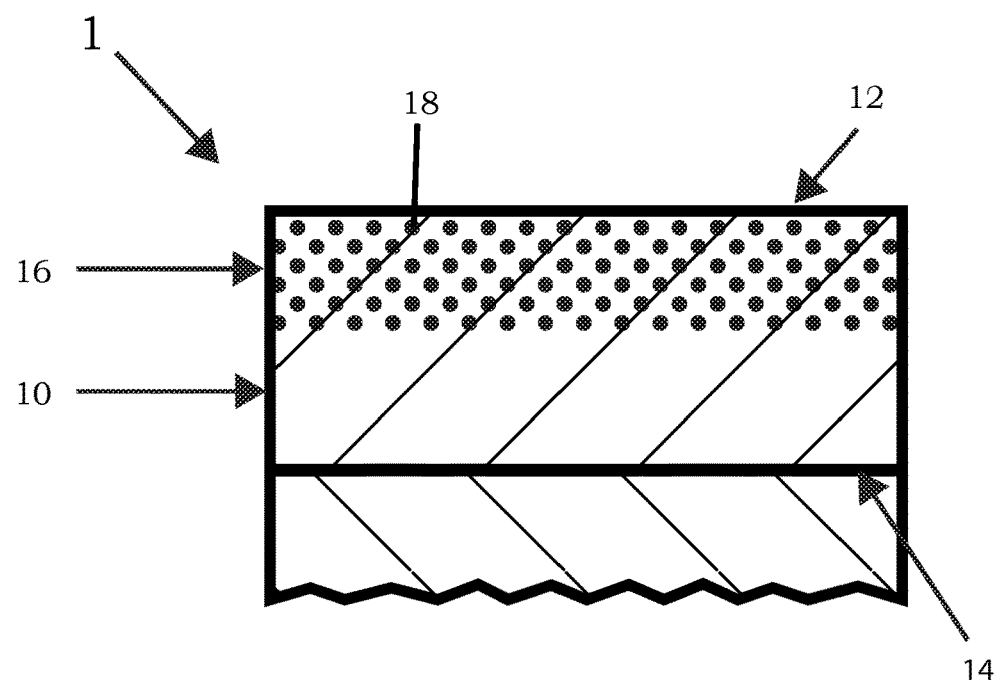
FIG. 2b is a side, sectional view of a substrate with a light extraction layer embedded within the substrate at the first surface and an external light extraction layer on or over the second surface of the substrate.

As shown in FIG. 2, in one embodiment, the article 1 may further comprise an external light extraction layer 22 positioned over the second surface 14 of the substrate 10. The external light extraction layer 22 can be formed by a coating, such as a metal oxide coating, having a roughened exterior surface. Examples of oxides useful for the external light extraction layer 22 include silica, alumina, zinc oxide, titania, zirconia, tin oxide and/or mixtures or alloys thereof. The external light extraction layer 22 can have an average surface roughness (Ra) in the range of 5 nm to 500 nm, such as 25 nm to 500 nm, such as 50 nm to 500 nm; such as 50 nm to 200 nm; such as 100 nm to 200 nm. The external light extraction layer 22 can have a root mean square roughness (Rq) in the range of 100 nm to 250 nm, such as 150 nm to 200 nm. The external light extraction layer 22 can have a thickness in the range of 10 nm to 500 nm, such as 50 nm to 500 nm, such as 100 nm to 500 nm. The external light extraction layer 22 can be a single layer or optionally a multilayer coating.

The roughness in the external light extract layer 22 can be created by several techniques. One technique is to form a coating having a roughened exterior surface. The coating can be a metal oxide, such as silica, alumina, zinc oxide, titania, zirconia, tin oxide, or mixtures thereof. Alternatively, the external light extraction layer 22 can be formed by texturing the second surface 14 of the glass, such as by mechanically roughening the surface of the substrate, such as by mechanical abrasion or chemical etching.

Figure 3A:
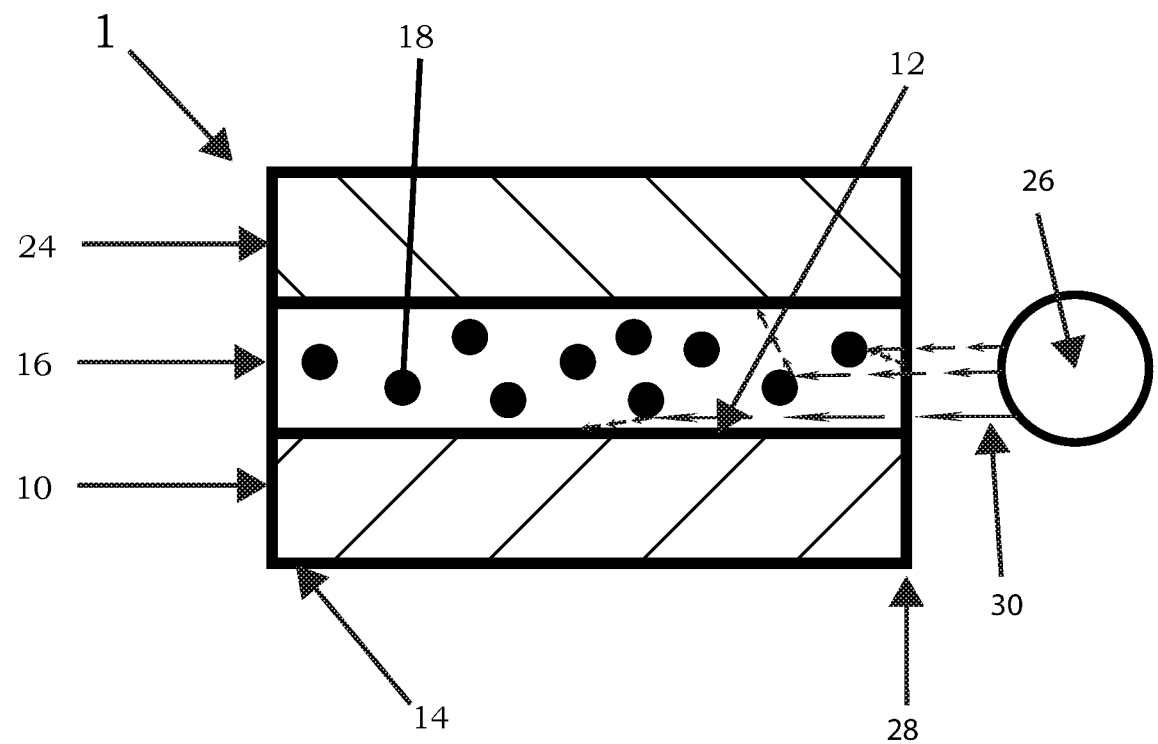
FIG. 3a is a side, sectional view of a privacy glass with a light extraction layer over the first surface of the substrate according to the invention.
Figure 3B:
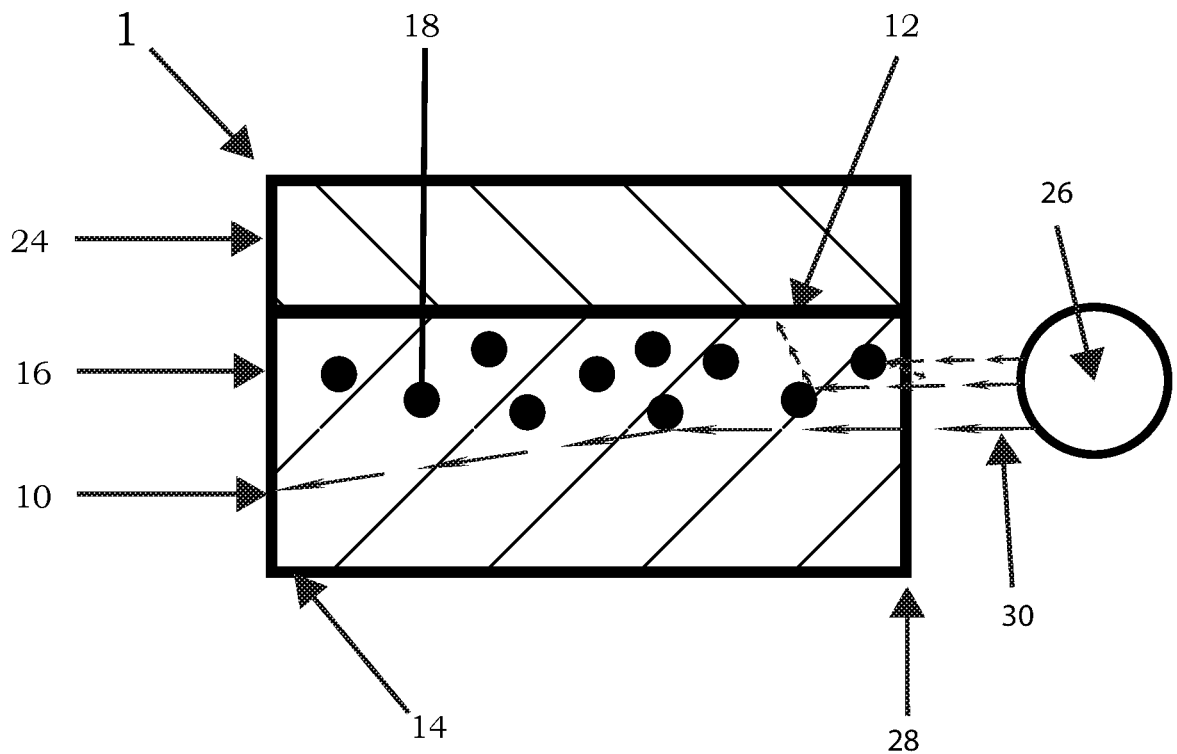
FIG. 3b is a side, sectional view of a privacy glass with a light extraction layer embedded within the substrate at the first surface according to the invention.

The light extraction layer 16 with nanoparticle 18 can be used in various applications. In one embodiment, as shown in FIG. 3A and FIG. 3B, the article 1 is a privacy glazing.

The article 1 has a substrate 10. A light extraction layer 16 is formed over at least a portion of the first surface 12 of the substrate 10, or is embedded within the substrate 10 at the first surface 12. The light extraction layer 16 comprises nanoparticles 18 as described above. An optional coating 24 may be present. The optional coating 24 may be one or more layers as described below used in the OLED article. For example, the optional coating 24 may be an anode layer. Alternatively, the optional coating 24 can be a metal oxide, metal nitride, metal oxynitrides or metal. For example, the optional coating 24 may be zinc oxide, zinc stannate, tin oxide, silicon nitride, titania, silica, alumina, silver, gold, copper, mixtures thereof or alloys thereof. A light source 26 is located adjacent an edge 28 of the article 1. When the light source 26 is deactivated, the article 1 has a first transparency level. When the light source 26 is active, the nanoparticles 18 scatter the light waves 30 from the light source 26 and the article has a second transparency level. The second transparency level is less than the first transparency level due to the scatting of the light waves 30 by the nanoparticles 18.

Figure 4A:
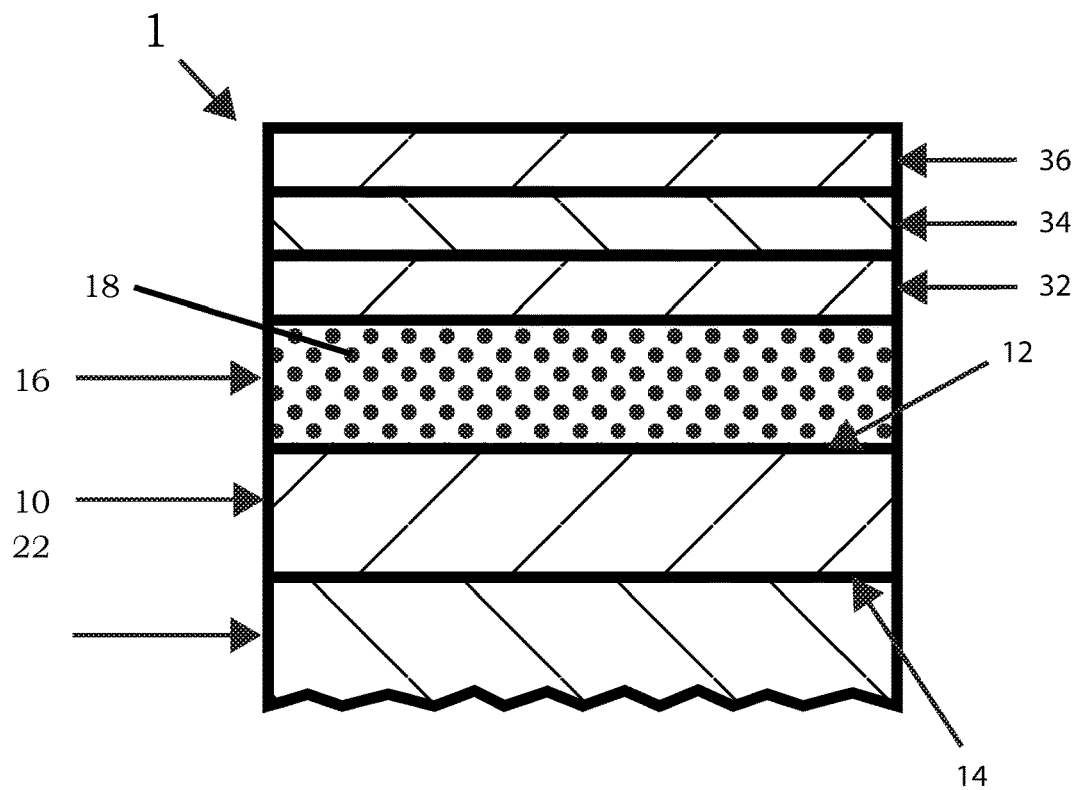
FIG. 4a is a side, sectional view of an organic light emitting diode with a light extraction layer over the first surface of the substrate according to the invention.
Figure 4B:
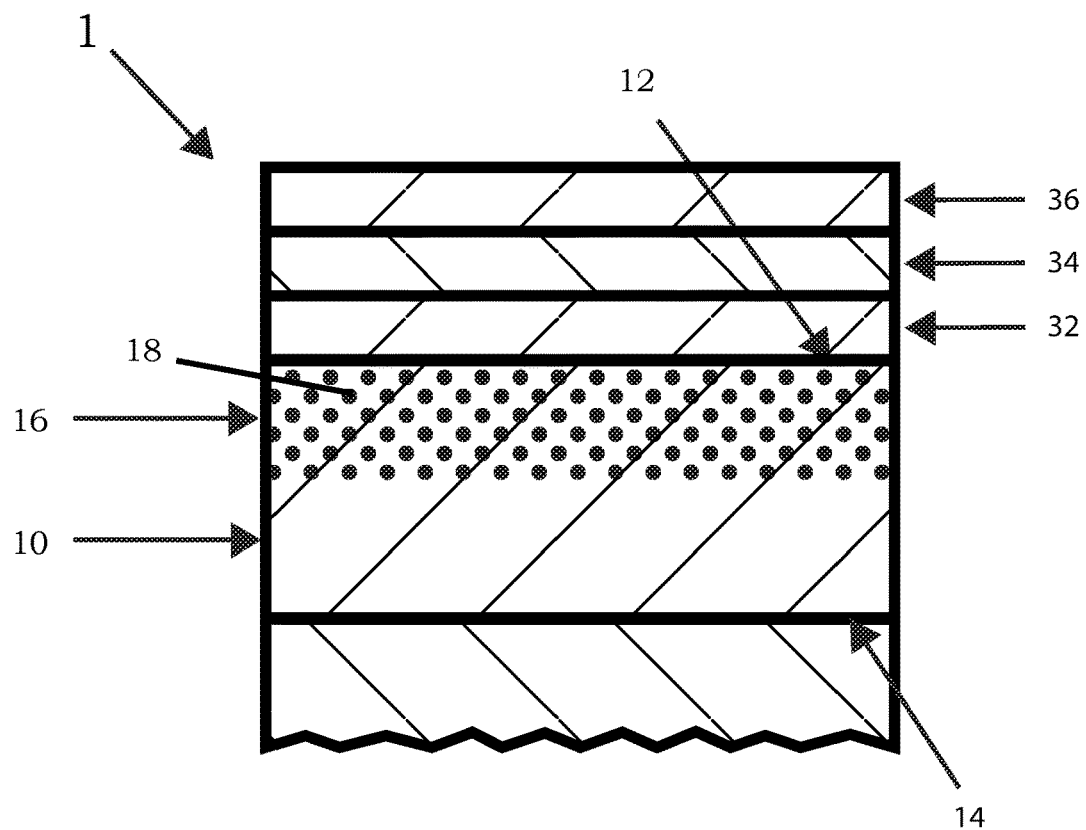
FIG. 4b is a side, sectional view of an organic light emitting diode with a light extraction layer embedded within the first surface of the substrate according to the invention.

In another embodiment, the light extraction layer 16 can be used in an organic light emitting diode ("OLED"). Thus, the article 1 is an OLED. In this embodiment, as shown in FIG. 4A and FIG. 4B, the OLED 1 includes a substrate 10, a light extraction layer 16 comprising a nanoparticle 18 over a first surface 12 of the substrate 10, the external light extraction layer 22 over a second surface 14 of the substrate 10, a cathode 32, an emissive layer 34 and an anode 36.

The cathode 32 can be any conventional OLED cathode. Examples of suitable cathodes 32 include (but are not limited to) barium and calcium.

The emissive layer 34 can be a conventional organic electroluminescent layer as known in the art. Examples of such materials include, but are not limited to, small molecules such as organometallic chelates (e.g., Alq3), fluorescent and phosphorescent dyes, and conjugated dendrimers. Examples of suitable materials include triphenylamine, perylene, rubrene, and quinacridone. Alternatively, electroluminescent polymeric materials are also known. Examples of such conductive polymers include poly(p-phenylene vinylene) and polyfluorene. Phosphorescent materials could also be used. Examples of such materials include polymers such as poly(n-vinylcarbazole) in which an organometallic complex, such as an iridium complex, is added as a dopant.

The anode 36 can be a conductive, transparent material, such as a metal oxide material, such as, but not limited to, iridium tin oxide (ITO) or aluminum-doped zinc oxide (AZO).

The invention further relates to a method of forming a light extraction layer on a substrate. A substrate is provided wherein the substrate is a glass ribbon in a metal float bath. The substrate is floating on the metal float bath. The substrate has a temperature. The temperature of the substrate is below 850° C., preferably below 800° C., most preferably below 750° C., most preferably below 725° C.; and above 400° C., preferably above 550° C., more preferably above 575° C., most preferably above 600° C. For example, the temperature can be about 650° C. A boron precursor is applied over the substrate while the substrate is at the temperature. Optionally, a silicon precursor is applied before, during or immediately after the application of the boron precursor. Preferably, the silicon precursor is applied over the substrate while the substrate is at the temperature. Optionally, a nanoparticle precursor is applied before, during or immediately after the application of the boron precursor. Alternatively, the nanoparticles cannot be applied; therefore, the coated article would not have nanoparticles within the internal light extraction layer.

The invention further relates to a method of forming a light extraction layer on a substrate. A substrate is provided wherein the substrate is a glass ribbon in a metal float bath. The substrate is floating on the metal float bath. The substrate has a temperature. A nanoparticle precursor is applied to the substrate in a manner that causes the nanoparticles to embed fully or to embed partially within the substrate. The temperature of the substrate is below 850° C., preferably below 800° C., most preferably below 750° C., most preferably below 725° C.; and above 500° C., preferably above 550° C., more preferably above 575° C., most preferably above 600° C. For example, the temperature can be about 650° C. A boron precursor is applied over the substrate and over the nanoparticles while the substrate is at the temperature. Optionally, a silicon precursor is applied before, during or immediately after the application of the boron precursor. The optional silicon precursor can be applied while the substrate is at the temperature.

The invention further relates to a method of forming a light extraction layer on a substrate. A substrate is provided wherein the substrate is a glass ribbon in a metal float bath. The substrate is floating on the metal float bath. The substrate has a temperature. A nanoparticle precursor is applied to the substrate in a manner that causes the nanoparticles to embed fully or to embed partially within the substrate. The temperature of the substrate is below 850° C., preferably below 800° C., most preferably below 750° C., most preferably below 725° C.; and above 500° C., preferably above 550° C., more preferably above 575° C., most preferably above 600° C. For example, the temperature can be about 650° C. A boron precursor is applied over the substrate and over the nanoparticles while the substrate is at the temperature. The boron precursor may be applied at the same time (e.g. co-precipitated) or immediately after the nanoparticle precursor is applied. Optionally, a silicon precursor is applied before, during or immediately after the application of the boron precursor.

The invention further relates to a method of forming a light extraction layer on a substrate. A substrate is provided wherein the substrate is glass or a glass ribbon. A nanoparticle precursor is applied to the substrate in a manner that causes the nanoparticles to embed fully within, to embed partially within, or to rest on top of the substrate. The substrate has a temperature. The temperature of no more than 650° C., preferably no more than 630° C., more preferably no more than 620° C., most preferably no more than 610° C.; and/or at a temperature of at least 400° C.; preferably at least 500° C.; more preferably at least 525° C.; most preferably at least 550° C. For example, substrate 10 may be at a temperature of about 600° C. A boron precursor is applied over the substrate while the substrate is at the temperature. Optionally, a silicon precursor is applied before, during or immediately after the application of the first boron precursor, and/or the second boron precursor.

The invention further relates to a method of forming a light extraction layer on a substrate. A substrate is provided wherein the substrate is glass or a glass ribbon. A nanoparticle precursor is applied to the substrate in a manner that causes the nanoparticles to embed fully within, to embed partially within, or to rest on top of the substrate. The substrate has a temperature. The temperature of no more than 650° C., preferably no more than 630° C., more preferably no more than 620° C., most preferably no more than 610° C.; and/or at a temperature of at least 400° C.; preferably at least 500° C.; more preferably at least 525° C.;

most preferably at least 550° C. For example, substrate 10 may be at a temperature of about 600° C. A boron precursor is applied over the substrate while the substrate is at the temperature. The boron precursor may be applied at the same time (e.g. co-precipitated) or immediately after the nanoparticle precursor is applied. Optionally, a silicon precursor is applied before, during or immediately after the application of the first boron precursor, and/or the second boron precursor.

The invention further relates to a method of forming a light extraction layer on a substrate. A substrate is provided wherein the substrate is glass or a glass ribbon. A nanoparticle precursor is applied to the substrate in a manner that causes the nanoparticles to embed fully within, to embed partially within, or to rest on top of the substrate. The substrate has a temperature. The temperature of no more than 500° C., preferably no more than 300° C., more preferably no more than 200° C., most preferably no more than 100° C. For example, substrate 10 may be at a temperature of between 20-25° C., or can be at room temperature. A boron precursor is applied over the substrate while the substrate is at the temperature. Optionally, a silicon precursor is applied before, during or immediately after the application of the first boron precursor, and/or the second boron precursor.

The invention further relates to a method of forming a light extraction layer on a substrate. A substrate is provided wherein the substrate is glass or a glass ribbon. A nanoparticle precursor is applied to the substrate in a manner that causes the nanoparticles to embed fully within, to embed partially within, or to rest on top of the substrate. The substrate has a temperature. The temperature of no more than 500° C., preferably no more than 300° C., more preferably no more than 200° C., most preferably no more than 100° C. For example, substrate 10 may be at a temperature of between 20-25° C., or can be at room temperature. A boron precursor is applied over the substrate while the substrate is at the temperature. The boron precursor may be applied at the same time (e.g. co-precipitated) or immediately after the nanoparticle precursor is applied. Optionally, a silicon precursor is applied before, during or immediately after the application of the first boron precursor, and/or the second boron precursor.

In another embodiment, the invention further relates to a method of forming a light extraction layer on a substrate. A substrate is provided wherein the substrate is a glass ribbon in a metal float bath. The substrate is floating on the metal float bath. The substrate has a temperature. A light extraction layer is formed over or partially embedded within the substrate. The temperature of the substrate is below 850° C., preferably below 800° C., most preferably below 750° C., most preferably below 725° C.; and above 500° C., preferably above 550° C., more preferably above 575° C., most preferably above 600° C. For example, the temperature can be about 650° C. A first boron precursor is applied over the substrate while the substrate is at the temperature forming a first portion of the light extraction layer. A nanoparticle precursor is applied after the first portion of the light extraction layer in a manner that causes the nanoparticles to embed fully or to embed partially within the first portion of the light extraction layer. The nanoparticle precursor can be applied when the substrate coated with the first portion of the light extraction layer is at a temperature of below 850° C., preferably below 800° C., most preferably below 750° C., most preferably below 725° C.; and above 500° C., preferably above 550° C., more preferably above 575° C., most preferably above 600° C. For example, the temperature can be about 650° C. Alternatively, the temperature when the nanoparticles precursor is applied can be no more than 650° C., preferably no more than 630° C., more preferably no more than 620° C., most preferably no more than 610° C.; and/or at a temperature of at least 400° C.; preferably at least 500° C.; more preferably at least 525° C.; most preferably at least 550° C. For example, substrate 10 may be at a temperature of about 600° C. Alternatively, the temperature when the nanoparticles precursor is applied can be no more than 500° C., preferably no more than 300° C., more preferably no more than 200° C., most preferably no more than 100° C. For example, substrate 10 may be at a temperature of between 20-25° C., or can be at room temperature. A second boron precursor is applied over the nanoparticles in a manner that produces a generally smooth surface wherein the average surface roughness is less than 5 nm. The second boron precursor can be applied when the substrate coated with the first portion of the light extraction layer and the nanoparticles has a temperature below 850° C., preferably below 800° C., most preferably below 750° C., most preferably below 725° C.; and above 500° C., preferably above 550° C., more preferably above 575° C., most preferably above 600° C. For example, the temperature can be about 650° C. Alternatively, the second boron precursor can be applied when the temperature is no more than 650° C., preferably no more than 630° C., more preferably no more than 620° C., most preferably no more than 610° C.; and/or at a temperature of at least 400° C.; preferably at least 500° C.; more preferably at least 525° C.; most preferably at least 550° C. For example, the temperature may be about 600° C. Alternatively, the temperature when the second boron precursor is applied can be no more than 500° C., preferably no more than 300° C., more preferably no more than 200° C., most preferably no more than 100° C. For example, the substrate may be at a temperature of between 20-25° C., or can be at room temperature. The first boron precursor and the second boron precursor can be the same precursor. Optionally, a silicon precursor is applied before, during or immediately after the application of the first boron precursor, and/or the second boron precursor.

In another embodiment, the invention further relates to a method of forming a light extraction layer on a substrate. A substrate is provided wherein the substrate is a glass ribbon in a metal float bath. The substrate is floating on the metal float bath. The substrate has a temperature. A light extraction layer is formed over or partially embedded within the substrate. The temperature of the substrate is below 850° C., preferably below 800° C., most preferably below 750° C., most preferably below 725° C.; and above 500° C., preferably above 550° C., more preferably above 575° C., most preferably above 600° C. For example, the temperature can be about 650° C. A first boron precursor is applied over the substrate while the substrate is at the temperature forming a first portion of the light extraction layer. A nanoparticle precursor is applied after the first portion of the light extraction layer in a manner that causes the nanoparticles to embed fully or to embed partially within the first portion of the light extraction layer. The nanoparticle precursor can be applied when the substrate coated with the first portion of the light extraction layer is at a temperature of below 850° C., preferably below 800° C., most preferably below 750° C., most preferably below 725° C.; and above 500° C., preferably above 550° C., more preferably above 575° C., most preferably above 600° C. For example, the temperature can be about 650° C. Alternatively, the temperature when the nanoparticles precursor is applied can be no more than 650° C., preferably no more than 630° C., more preferably no more than 620° C., most preferably no more than 610° C.; and/or at a temperature of at least 400° C.; preferably at least 500° C.; more preferably at least 525° C.; most preferably at least 550° C. For example, substrate 10 may be at a temperature of about 600° C. Alternatively, the temperature when the nanoparticles precursor is applied can be no more than 500° C., preferably no more than 300° C., more preferably no more than 200° C., most preferably no more than 100° C. For example, substrate 10 may be at a temperature of between 20-25° C., or can be at room temperature. A second boron precursor is applied over the nanoparticles in a manner that produces a generally smooth surface wherein the average surface roughness is less than 5 nm. The second boron precursor can be applied when the substrate coated with the first portion of the light extraction layer and the nanoparticles has a temperature below 850° C., preferably below 800° C., most preferably below 750° C., most preferably below 725° C.; and above 500° C., preferably above 550° C., more preferably above 575° C., most preferably above 600° C. For example, the temperature can be about 650° C. Alternatively, the second boron precursor can be applied when the temperature is no more than 650° C., preferably no more than 630° C., more preferably no more than 620° C., most preferably no more than 610° C.; and/or at a temperature of at least 400° C.; preferably at least 500° C.; more preferably at least 525° C.; most preferably at least 550° C. For example, the temperature may be about 600° C. Alternatively, the temperature when the second boron precursor is applied can be no more than 500° C., preferably no more than 300° C., more preferably no more than 200° C., most preferably no more than 100° C. For example, substrate may be at a temperature of between 20-25° C., or can be at room temperature. The second boron precursor may be apply at the same time (e.g. co-precipitated) or immediately after the nanoparticle precursor is applied. The first boron precursor and the second boron precursor can be the same precursor. Optionally, a silicon precursor is applied before, during or immediately after the application of the first boron precursor, and/or the second boron precursor.

EXAMPLES

Example 1

A substrate having an internal light extraction layer was formed. The light extraction layer was applied over a glass ribbon in a tin float bath with a line speed to produce a 2.0 mm glass. A boron precursor, tri-methyl borate, was applied to the glass ribbon when the glass ribbon had a temperature of about 725° C. Based on our understanding of the boron precursor, the temperature could be in the range of 600–725° C. The resulting product had an internal light extraction layer that was intergrated into the glass. The light extraction layer contained 20-30 atomic % boron, and 10-20 atomic % silicon (excluding oxygen), in the form of borate ($B_2O_3$) and silica ($SiO_2$); therefore, the internal light extraction layer comprised a borosilicate. The glass ribbon was cooled, cut and packaged, wherein a third-party could apply transparent conductive oxide coatings and/or other OLED panel coatings.

Example 2

A substrate having a light extraction layer with nanoparticles was formed. The substrate was a soda lime glass. A titanium precursor, namely titanium isopropoxide, was applied over the glass. A boron precursor, namely tri-methyl borate, was applied to form a borate layer to cover the titania particles and generate a smooth surface. The process was done in a low temperature furnace wherein the temperature was enough to deposit the particles onto the glass surface, and cover the particles with a smooth $B_2O_3$ layer. The temperature was approximately 600° C. The resulting layer had titania particles fully embedded in the $B_2O_3$ layer at a depth of 0.7 microns, wherein the $B_2O_3$ layer was 1-1.25 microns thick.

This morphology means that one could form a $B_2O_3$ layer first, then apply the $TiO_2$ particles later and embed the particles into the $B_2O_3$ layer. Alternatively, 0.3 microns of the $B_2O_3$ could be applied first, then the titania particles and $B_2O_3$ precursor could be co-precipitated to form the top portion of the light extraction layer.

The XPS analysis of the light extraction layer shows that silicon was present in the $B_2O_3$ layer, which was caused by diffusion of the silicon from the glass into the $B_2O_3$ layer thereby forming a borosilicate. This means that one may eliminate the need to deposit or co-deposit a silicon precursor when depositing the boron precursor and still form a borosilicate layer.

The invention is further described in the following numbered clauses.

Clause 1: A light extraction substrate comprising a glass, the glass comprising a first surface and a second surface; and a light extraction layer over the first surface, wherein the light extraction layer comprises borosilicate.

Clause 2: The light extraction substrate of clause 1 wherein the light extraction layer further comprises a nanoparticle.

Clause 3: The light extraction substrate of clause 1 or 2 wherein the nanoparticle is a high index of refraction material.

Clause 4: The light extraction substrate of clause 2 or 3 wherein the nanoparticle is titania.

Clause 5: The light extraction substrate of any of the clauses 1 to 4 wherein the light extraction layer has an average surface roughness of less than 5 nm.

Clause 6: The light extraction substrate of any of the clauses 2 to 5 wherein the nanoparticle has a diameter of at most 40 nm.

Clause 7: The light extraction substrate of any of the clauses 1 to 6 wherein the light extraction layer as a thickness of at most 2 μm.

Clause 8: The light extraction substrate of any of the clauses 1 to 7 further comprising a second light extraction layer on or adjacent the second surface, the second light extraction layer having a surface roughness of at least 10 nm.

Clause 9: The light extraction substrate of clause 8, wherein the surface roughness of the second light extraction layer is at least 50 nm and at most 500 nm.

Clause 10: The light extraction substrate of clause 8, wherein the second light extraction layer is formed by texturing the surface of the second surface of the glass.

Clause 11: The light extraction substrate of any of the clauses 1 to 10 further comprising a haze of at least 20%, preferably at least 30%, more preferably at least 35%, most preferably at least 37%.

Clause 12: The light extraction substrate of any of the clauses 1 to 11 further comprising an anode deposited over the first surface of the glass.

Clause 13: The light extraction substrate of any of the clauses 1 to 12 further comprising an underlayer coating stack deposited over the first surface of the glass.

Clause 14: An organic light emitting device comprising: a substrate having a first surface and a second surface; a light extraction layer over the first surface of the substrate, wherein the light extraction layer comprises a borosilicate layer; a transparent conductive oxide layer over the light extraction layer; an emissive layer; and a cathode.

Clause 15: The organic light emitting device of clause 14 wherein the light extraction layer further comprises a nanoparticle.

Clause 16: The organic light emitting device of clause 15 wherein the nanoparticle is a high index of refraction material.

Clause 17: The organic light emitting device of clause 15 or 16 wherein the nanoparticle is titania.

Clause 18: The organic light emitting device of any of the clauses 14 to 17 wherein the light extraction layer has an average surface roughness of less than 5 nm.

Clause 19: The organic light emitting device of any of the clauses 14 to 18 wherein the nanoparticle has a diameter of at most 5 nm.

Clause 20: The organic light emitting device of any of the clauses 14 to 19 wherein the light extraction layer as a thickness of at most 2 µm.

Clause 21: The organic light emitting device of any of the clauses 14 to 20 further comprising an external light extraction layer positioned over the second surface of the substrate having an average surface roughness of at least 50 nm.

Clause 22: The organic light emitting device of any of the clauses 14 to 21 further comprising a second light extraction layer on or adjacent the second surface, the second light extraction layer having a surface roughness of at least 10 nm.

Clause 23: The organic light emitting device of clause 22, wherein the surface roughness of the second light extraction layer is at least 50 nm and at most 500 nm.

Clause 24: The organic light emitting device of clause 22 or 23, wherein the second light extraction layer is formed by texturing the surface of the second surface of the glass.

Clause 25: The organic light emitting device of any of the clauses 14 to 24 further comprising a hale of at least 20%, preferably at least 30%, more preferably at least 35%, most preferably at least 37%.

Clause 26: The organic light emitting device of any of the clauses 24 to 25 further comprising an anode deposited over the first surface of the glass.

Clause 27: The organic light emitting device of any of the clauses 14 to 26 further comprising an underlayer coating stack deposited over the first surface of the glass.

Clause 28: A method of making a light extraction substrate comprising: pouring a glass melt onto a molten metal bath; and applying a boron precursor over the glass melt while the glass melt has a temperature of at least 600° C. and not more than 725° C.

Clause 29: The method of clause 28 wherein the boron precursor is applied to the glass melt to produce a borosilicate.

Clause 30: The method of clause 28 or 29 wherein the temperature of the glass melt is at least 650° C., and the boron precursor is applied without a silicon precursor to form a borosilicate.

Clause 31: The method of any of the clauses 28 to 30, further comprising applying a silicon precursor to form the borosilicate.

Clause 32: The method of any of the clauses 28 to 31, further comprising applying a silicon precursor while the temperature of the glass melt is at least 600° C. and not more than 725° C.

Clause 33: The method of any of the clauses 28 to 32 further comprising applying a nanoparticle precursor to form a nanoparticle within a layer formed by the boron precursor.

Clause 34: The method according to any of the clauses 28 to 33, further comprising applying a silicon precursor simultaneously with the applying the boron precursor step.

Clause 35: The method according to clause 33 or 34, wherein the nanoparticle precursor is applied simultaneously with the applying the boron precursor step.

Clause 36: The method according to any of the clauses 33 to 35, wherein the nanoparticle precursor comprising titanium tetrachloride.

Clause 37: The method according to any of the clauses 33 to 36, wherein the nanoparticle comprises titania.

Clause 38: A method of making a light extraction substrate, the method comprising: pouring a glass melt onto a molten metal bath wherein the glass melt comprises silicon or silica; and applying a boron precursor over the glass melt while the glass melt has a temperature of at least 600° C. and not more than 725° C. wherein the silicon or silica within the glass melt reacts with the boron precursor to form a borosilicate over the glass melt.

Clause 39: The method of clause 38 wherein the temperature of the glass melt is at least 650° C., and the boron precursor is applied without a silicon precursor to form a borosilicate.

Clause 40: The method of clause 38, wherein the temperature of the glass melt is less than 850° C., and further comprising applying a silicon precursor.

Clause 41: The method of any of the clauses 38 to 40, further comprising applying a nanoparticle precursor to form a nanoparticle within a layer formed by the boron precursor.

Clause 42: The method according to clause 38, 40 or 41, further comprising applying a silicon precursor simultaneously with the applying the boron precursor step.

Clause 43: The method according to any of the clauses 38 to 42, wherein the nanoparticle precursor is applied simultaneously with the applying the boron precursor step.

Clause 44: The method according to clause 43, wherein the nanoparticle precursor comprises titanium tetrachloride.

Clause 45: The method according to clause 43 or 44, wherein the nanoparticle comprises titania.

Clause 46: A method of making a light extraction substrate, the method comprising pouring a glass melt onto a molten metal bath wherein the glass melt comprises silicon; applying a boron precursor over the glass melt, wherein the glass melt has a temperature of less than 725° C.; and applying a silicon precursor over the glass melt, wherein the glass melt has a temperature of less than 725° C., wherein the silicon precursor and boron precursor form a borosilicate over or within the glass melt.

Clause 47: The method of clause 46 wherein the boron precursor is applied to the glass melt to produce the borosilicate within the glass melt.

Clause 48: The method of clause 46 or 47 further comprising applying a nanoparticle precursor to form a nanoparticle within a layer formed by the boron precursor.

Clause 49: The method according to any of the clauses 46 to 48, further comprising applying a silicon precursor simultaneously with the applying the boron precursor step.

Clause 50: The method according to clause 48 or 49, wherein the nanoparticle precursor is applied simultaneously with the applying the boron precursor step.

Clause 51: The method according to any of the clauses 48 to 50, wherein the nanoparticle precursor comprises titanium tetrachloride.

Clause 52: The method according to any of the clauses 48 to 51, wherein the nanoparticle comprises titania.

Clause 53: The method according to any of the clauses 46 to 51 wherein the light extraction substrate comprises a haze of at least 20%, preferably at least 30%, more preferably at least 35%, most preferably at least 37%.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

The invention claimed is:

1. A light extraction substrate comprising a glass, the glass comprising a first surface and a second surface; and a light extraction layer over the first surface, wherein the light extraction layer comprises borosilicate and nanoparticles, wherein the light extraction layer is at least partially embedded into the glass, and wherein at least a portion of the borosilicate and the nanoparticles are integrated into the glass below the first surface.

2. The light extraction substrate of claim 1 wherein the nanoparticles are formed from a material having a higher refractive index than a refractive index of the glass of the light extraction substrate.

3. The light extraction substrate of claim 1 wherein the light extraction layer has a thickness of at most 2.25 µm.

4. The light extraction substrate of claim 1 further comprising a second light extraction layer on or adjacent the second surface, the second light extraction layer having a surface roughness of 50 nm to 500 nm.

5. The light extraction substrate of claim 4, wherein the surface roughness of the second light extraction layer is at least 150 nm and at most 200 nm.

6. The light extraction substrate of claim 1 further comprising a haze of at least 20%.

7. The light extraction substrate of claim 1 further comprising an anode deposited over the light extraction layer of the glass.

8. The light extraction substrate of claim 1, wherein the borosilicate is a non-alkali metal borosilicate.

9. The light extraction substrate of claim 2, wherein the nanoparticles comprise alumina, titania, cerium oxide, zinc oxide, tin oxide, silica, zirconia, mixtures thereof, or alloys thereof.

10. The light extraction substrate of claim 9, wherein the nanoparticles comprise titania.

* * * * *

UNITED STATES PATENT AND TRADEMARK OFFICE
CERTIFICATE OF CORRECTION

PATENT NO. : 11,251,406 B2
APPLICATION NO. : 16/295566
DATED : February 15, 2022
INVENTOR(S) : Cheng-Hung Hung et al.

It is certified that error appears in the above-identified patent and that said Letters Patent is hereby corrected as shown below:

On the Title Page

Column 2, Item (57) Abstract, Line 3, Delete "boroate," and insert -- borate, --

Signed and Sealed this
Eleventh Day of October, 2022

Katherine Kelly Vidal
*Director of the United States Patent and Trademark Office*